United States Patent
Rajpal et al.

(10) Patent No.: US 12,453,652 B2
(45) Date of Patent: Oct. 28, 2025

(54) SYSTEMS AND METHODS TREATING FOR CORNEAL ECTATIC DISORDERS

(71) Applicant: Avedro, Inc., Waltham, MA (US)

(72) Inventors: Rajesh K. Rajpal, McLean, VA (US); Grace Elizabeth Lytle, Boston, MA (US)

(73) Assignee: Avedro, Inc., Burlington, MA (US)

( * ) Notice: Subject to any disclaimer, the term of this patent is extended or adjusted under 35 U.S.C. 154(b) by 646 days.

(21) Appl. No.: 16/575,428

(22) Filed: Sep. 19, 2019

(65) Prior Publication Data

US 2020/0085617 A1     Mar. 19, 2020

Related U.S. Application Data (60) Provisional application No. 62/733,617, filed on Sep. 19, 2018.

(51) Int. Cl.
| | |
|---|---|
| *A61F 9/008* | (2006.01) |
| *A61F 9/00* | (2006.01) |
| *A61N 5/06* | (2006.01) |

(52) U.S. Cl.
CPC ............ *A61F 9/0017* (2013.01); *A61N 5/062* (2013.01); *A61F 2009/00872* (2013.01);
(Continued)

(58) Field of Classification Search
CPC ...... A61F 9/0017; A61F 9/008; A61F 9/0079; A61F 2009/00872; A61F 2009/00893;
(Continued)

(56) References Cited

U.S. PATENT DOCUMENTS

| | | |
|---|---|---|
| 4,034,750 A | 7/1977 | Seiderman |
| 4,665,913 A | 5/1987 | L'Esperance, Jr. |
| (Continued) | | |

FOREIGN PATENT DOCUMENTS

| | | |
|---|---|---|
| CN | 105682620 A | 6/2016 |
| JP | 2014519866 A | 8/2014 |
| (Continued) | | |

OTHER PUBLICATIONS

Seiler TG, Fischinger I, Koller T, Zapp D, Frueh BE, Seiler T. Customized Corneal Cross-linking: One-Year Results. Am J Ophthalmol. Jun. 2016;166:14-21. doi: 10.1016/j.ajo.2016.02.029. Epub Mar. 2, 2016. PMID: 26944278. (Year: 2016).*

(Continued)

*Primary Examiner* — Lynsey C Eiseman
(74) *Attorney, Agent, or Firm* — K&L Gates LLP (57) ABSTRACT

To treat corneal ectatic disorders, systems and methods can precisely apply photoactivating light to specified areas of a cornea treated with a cross-linking agent. An example system includes a light source that provides a photoactivating light to photoactivate a cross-linking agent applied to an eye. The system includes optical element(s) that transmit the photoactivating light to the eye according to a pattern defined by a plurality of treatment zones. The treatment zones are delivered to different respective areas on the eye. The plurality of treatment zones includes at least a first treatment zone and a second treatment zone. The first treatment zone provides a first dose of the photoactivating light. The second treatment zone provides a second dose of the photoactivating light. The first dose is greater than the second dose. The first treatment zone is disposed within an inner boundary of the second treatment zone.

14 Claims, 3 Drawing Sheets

(52) U.S. Cl.
CPC .............. *A61F 2009/00893* (2013.01); *A61N 2005/0661* (2013.01); *A61N 2005/0662* (2013.01); *A61N 2005/0665* (2013.01)

(58) Field of Classification Search
CPC ............ A61N 5/062; A61N 2005/0662; A61N 2005/0665; A61N 2005/0661
See application file for complete search history.

(56) References Cited

U.S. PATENT DOCUMENTS

| | | | |
|---|---|---|---|
| 4,712,543 | A | 12/1987 | Baron |
| 4,764,007 | A | 8/1988 | Task |
| 4,891,043 | A | 1/1990 | Zelmer et al. |
| 4,969,912 | A | 11/1990 | Kelman et al. |
| 4,994,058 | A | 2/1991 | Raven et al. |
| 5,019,074 | A | 5/1991 | Muller |
| 5,171,318 | A | 12/1992 | Gibson et al. |
| 5,281,211 | A | 1/1994 | Parel et al. |
| 5,332,802 | A | 7/1994 | Kelman et al. |
| 5,461,212 | A | 10/1995 | Seiler et al. |
| 5,490,849 | A | 2/1996 | Smith |
| 5,512,966 | A | 4/1996 | Snook |
| 5,562,656 | A | 10/1996 | Sumiya |
| 5,624,437 | A | 4/1997 | Freeman et al. |
| 5,779,696 | A | 7/1998 | Berry et al. |
| 5,786,893 | A | 7/1998 | Fink et al. |
| 5,891,131 | A | 4/1999 | Rajan et al. |
| 5,910,110 | A | 6/1999 | Bastable |
| 6,033,396 | A | 3/2000 | Huang et al. |
| 6,139,876 | A | 10/2000 | Kolta |
| 6,161,544 | A | 12/2000 | DeVore et al. |
| 6,188,500 | B1 | 2/2001 | Rudeen et al. |
| 6,218,360 | B1 | 4/2001 | Cintron et al. |
| 6,270,221 | B1 | 8/2001 | Liang et al. |
| 6,280,436 | B1 | 8/2001 | Freeman et al. |
| 6,319,273 | B1 | 11/2001 | Chen et al. |
| 6,322,557 | B1 | 11/2001 | Nikolaevich et al. |
| 6,325,792 | B1 | 12/2001 | Swinger et al. |
| 6,394,999 | B1 | 5/2002 | Williams et al. |
| 6,478,792 | B1 | 11/2002 | Hansel |
| 6,520,956 | B1 | 2/2003 | Huang |
| 6,520,958 | B1 | 2/2003 | Shimmick et al. |
| 6,537,545 | B1 | 3/2003 | Karageozian et al. |
| 6,571,118 | B1 | 5/2003 | Utzinger et al. |
| 6,617,963 | B1 | 9/2003 | Watters et al. |
| 6,946,440 | B1 | 9/2005 | DeWoolfson et al. |
| 7,001,374 | B2 | 2/2006 | Peyman |
| 7,004,902 | B2 | 2/2006 | Luce |
| 7,044,945 | B2 | 5/2006 | Sand |
| 7,073,510 | B2 | 7/2006 | Redmond et al. |
| 7,331,350 | B2 | 2/2008 | Kochevar et al. |
| 7,402,562 | B2 | 7/2008 | DeWoolfson et al. |
| 7,731,362 | B2 | 6/2010 | Gerlach |
| 7,753,943 | B2 | 7/2010 | Strong |
| 7,898,656 | B2 | 3/2011 | Yun et al. |
| 7,935,058 | B2 | 5/2011 | Dupps et al. |
| 8,111,394 | B1 | 2/2012 | Borysow et al. |
| 8,115,919 | B2 | 2/2012 | Yun et al. |
| 8,366,689 | B2 | 2/2013 | Marshall et al. |
| 8,414,911 | B2 | 4/2013 | Mattson et al. |
| 8,475,437 | B2 | 7/2013 | Mrochen et al. |
| 2001/0055095 | A1 | 12/2001 | D'Souza et al. |
| 2002/0013577 | A1 | 1/2002 | Frey et al. |
| 2002/0159618 | A1 | 10/2002 | Freeman et al. |
| 2002/0164379 | A1 | 11/2002 | Nishihara et al. |
| 2003/0175259 | A1 | 9/2003 | Karageozian et al. |
| 2003/0189689 | A1 | 10/2003 | Rathjen |
| 2003/0231285 | A1 | 12/2003 | Ferguson |
| 2004/0002694 | A1 | 1/2004 | Pawlowski et al. |
| 2004/0093046 | A1 | 5/2004 | Sand |
| 2004/0199079 | A1 | 10/2004 | Chuck et al. |
| 2005/0038471 | A1 | 2/2005 | Chan et al. |
| 2005/0096515 | A1 | 5/2005 | Geng |
| 2005/0149006 | A1 | 7/2005 | Peyman |
| 2005/0271590 | A1 | 12/2005 | Schwartz et al. |
| 2006/0135957 | A1 | 6/2006 | Panescu |
| 2006/0149343 | A1 | 7/2006 | Altshuler et al. |
| 2006/0195076 | A1 | 8/2006 | Blumenkranz et al. |
| 2006/0276777 | A1 | 12/2006 | Coroneo |
| 2007/0024860 | A1 | 2/2007 | Tobiason et al. |
| 2007/0048340 | A1 | 3/2007 | Bran et al. |
| 2007/0123845 | A1 | 5/2007 | Lubatschowski |
| 2007/0135805 | A1 | 6/2007 | Peyman |
| 2007/0142828 | A1 | 6/2007 | Peyman |
| 2007/0265603 | A1* | 11/2007 | Pinelli .................... A61F 9/008 606/5 |
| 2008/0009901 | A1 | 1/2008 | Redmond et al. |
| 2008/0015660 | A1 | 1/2008 | Herekar |
| 2008/0063627 | A1 | 3/2008 | Stucke et al. |
| 2008/0114283 | A1 | 5/2008 | Mattson et al. |
| 2008/0139671 | A1 | 6/2008 | Herekar |
| 2008/0208177 | A1 | 8/2008 | Mrochen et al. |
| 2009/0116096 | A1 | 5/2009 | Zalevsky et al. |
| 2009/0149842 | A1 | 6/2009 | Muller et al. |
| 2009/0149923 | A1 | 6/2009 | Herekar |
| 2009/0171305 | A1 | 7/2009 | El Hage |
| 2009/0234335 | A1 | 9/2009 | Yee |
| 2009/0275929 | A1 | 11/2009 | Zickler |
| 2010/0028407 | A1 | 2/2010 | Del Priore et al. |
| 2010/0057060 | A1 | 3/2010 | Herekar |
| 2010/0069894 | A1 | 3/2010 | Mrochen et al. |
| 2010/0082018 | A1 | 4/2010 | Panthakey et al. |
| 2010/0094197 | A1 | 4/2010 | Marshall et al. |
| 2010/0114109 | A1 | 5/2010 | Peyman |
| 2010/0149487 | A1 | 6/2010 | Ribak |
| 2010/0173019 | A1 | 7/2010 | Paik et al. |
| 2010/0189817 | A1 | 7/2010 | Krueger et al. |
| 2010/0204584 | A1 | 8/2010 | Omberg et al. |
| 2010/0210996 | A1 | 8/2010 | Peyman |
| 2010/0318017 | A1 | 12/2010 | Lewis et al. |
| 2011/0077624 | A1 | 3/2011 | Brady et al. |
| 2011/0098790 | A1 | 4/2011 | Daxer |
| 2011/0118654 | A1 | 5/2011 | Muller et al. |
| 2011/0152219 | A1 | 6/2011 | Stagni et al. |
| 2011/0190742 | A1 | 8/2011 | Anisimov |
| 2011/0202114 | A1 | 8/2011 | Kessel et al. |
| 2011/0208300 | A1 | 8/2011 | Eugene et al. |
| 2011/0237999 | A1 | 9/2011 | Muller et al. |
| 2011/0264082 | A1 | 10/2011 | Mrochen |
| 2011/0288466 | A1 | 11/2011 | Muller et al. |
| 2011/0301524 | A1 | 12/2011 | Bueler et al. |
| 2012/0083772 | A1 | 4/2012 | Rubinfield et al. |
| 2012/0203161 | A1 | 8/2012 | Herekar |
| 2012/0215155 | A1* | 8/2012 | Muller .................. A61F 9/0079 604/20 |
| 2012/0289886 | A1 | 11/2012 | Muller et al. |
| 2012/0302862 | A1 | 11/2012 | Yun et al. |
| 2012/0303008 | A1 | 11/2012 | Muller et al. |
| 2012/0310083 | A1 | 12/2012 | Friedman et al. |
| 2012/0310223 | A1 | 12/2012 | Knox et al. |
| 2013/0060187 | A1 | 3/2013 | Friedman et al. |
| 2013/0085370 | A1 | 4/2013 | Friedman et al. |
| 2013/0116757 | A1 | 5/2013 | Russmann |
| 2014/0194957 | A1 | 7/2014 | Rubinfield et al. |
| 2014/0249509 | A1 | 9/2014 | Rubinfield et al. |
| 2016/0310319 | A1 | 10/2016 | Friedman et al. |
| 2016/0338588 | A1* | 11/2016 | Friedman ............. A61B 5/0036 |
| 2018/0235808 | A1 | 8/2018 | Muller et al. |

FOREIGN PATENT DOCUMENTS

| | | |
|---|---|---|
| JP | 2017532180 A | 11/2017 |
| RU | 2086215 | 8/1997 |
| RU | 2420330 | 6/2011 |
| RU | 2456971 | 7/2012 |
| WO | 2000074648 | 12/2000 |
| WO | 2001058495 | 8/2001 |
| WO | 2005110397 | 11/2005 |
| WO | 2006012947 | 2/2006 |
| WO | 2006128038 | 11/2006 |
| WO | 2007001926 | 1/2007 |
| WO | 2007053826 | 5/2007 |
| WO | 2007120457 | 10/2007 |

(56) References Cited

FOREIGN PATENT DOCUMENTS

| | | |
|---|---|---|
| WO | 2007139927 | 12/2007 |
| WO | 2007143111 | 12/2007 |
| WO | 2008000478 | 1/2008 |
| WO | 2008052081 | 5/2008 |
| WO | 2008095075 | 8/2008 |
| WO | 2009073213 | 6/2009 |
| WO | 2009114513 | 9/2009 |
| WO | 2009146151 | 12/2009 |
| WO | 2010011119 | 1/2010 |
| WO | 2010015255 | 2/2010 |
| WO | 2010023705 | 3/2010 |
| WO | 2010093908 | 8/2010 |
| WO | 2011019940 | 2/2011 |
| WO | 2011116306 | 9/2011 |
| WO | 2012004726 | 1/2012 |
| WO | 2012149570 | 11/2012 |
| WO | 2012174453 | 12/2012 |
| WO | 2013148713 | 10/2013 |
| WO | 2013148895 | 10/2013 |
| WO | 2013148896 | 10/2013 |
| WO | 2013149075 | 10/2013 |
| WO | 2014202736 | 12/2014 |
| WO | 2016069628 A1 | 5/2016 |

OTHER PUBLICATIONS

Shetty R, Pahuja N, Roshan T, Deshmukh R, Francis M, Ghosh A, Sinha Roy A. Customized Corneal Cross-linking Using Different UVA Beam Profiles. J Refract Surg. Oct. 1, 2017;33(10):676-682. doi: 10.3928/1081597X-20170621-07. PMID: 28991335. (Year: 2017).*

Cassagne M, Pierné K, Galiacy SD, Asfaux-Marfaing MP, Fournié P, Malecaze F. Customized Topography-Guided Corneal Collagen Cross-linking for Keratoconus. J Refract Surg. May 1, 2017;33(5):290-297. doi: 10.3928/1081597X-20170201-02. PMID: 28486719. (Year: 2017).*

Malecaze F. and Peirne K. "Concentrate on the Cone". Cataract & Refractive Surgery Today Europe (CRSTR). Mar. 2017; 52-54 (Year: 2017).*

Abahussin, M. "3D Collagen Orientation Study of the Human Cornea Using X-ray Diffraction and Femtosecond Laser Technology" Investigative Ophthalmology & Visual Science, Nov. 2009, vol. 50, No. 11, pp. 5159-5164 (6 pages).

Baier J. et al., "Singlet Oxygen Generation by UVA Light Exposure of Endogenous Photosensitizers," Biophysical Journal, vol. 91(4), pp. 1452-1459; Aug. 15, 2006 (8 pages).

Ballou, D. et al., "Direct Demonstration Of Superoxide Anion Production During The Oxidation Of Reduced Flavin And Of Its Catalytic Decomposition By Erythrocuprein," Biochemical And Biophysical Research Communications vol. 36, No. 6, pp. 898-904, Jul. 11, 1969 (7 pages).

Barbarino, S. et al., "Post-LASIK ectasia: Stabilization and Effective Managmeent with Riboflavin / ultraviolet A-induced collagen cross-linking," Association for Research in Vision and Ophthalmology, 2006 (1 page).

Bruel, A., "Changes In Biomechanical Properties, Composition Of Collagen And Elastin, And Advanced Glycation Endproducts Of The Rat Aorta In Relation To Age," Atherosclerosis 127, Mar. 14, 1996 (11 pages).

Chace, K.V. et al., Abstract for "The role of nonenzymatic glycosylation, transition metals, and free radicals in the formation of collagen aggregates", Arch Biochem Biophys., Aug. 1, 1991, 288(2) pp. 473-480 (1 page).

Chai, D. et al., "Quantitative Assessment of UVA-Riboflavin Corneal Cross-Linking Using Nonlinear Optical Microscopy," Investigative Ophthalmology & Visual Science, Jun. 2011, vol. 52, No. 7, 4231-4238 (8 pages).

Chan B.P., et al., "Effects of photochemical crosslinking on the microstructure of collagen and a feasibility study on controlled protein release;" Acta Biomaterialia, vol. 4, Issue 6, pp. 1627-1636; Jul. 1, 2008 (10 pages).

Clinical Trials.gov, "Riboflavin Mediated Corneal Crosslinking for Stabilizing Progression of Keratoconus (CCL)," University Hospital Freiburg, Feb. 20, 2008; retrieved from http://www.clinicaltrials.gov/ct2/show/NCT00626717, on Apr. 26, 2011 (3 pages).

Coskenseven E. et al., "Comparative Study of Corneal Collagen Cross-linking With Riboflaving and UVA Irradiation in Patients With Keratoconus," Journal of Refractive Surgery, vol. 25, issue 4, pp. 371-376; Apr. 2009 (6 pages).

Erskine H., "Avedro Becomes Sponsor of US FDA Clinical Trials of Corneal Collagen Crosslinking," Press Release, Mar. 16, 2010 (1 page).

Fite et al. Noninvasive Multimodal Evaluation of Bioengineered Cartilage Constructs Combining Time-Resolved Fluorescence and Ultrasound Imaging. Tissue Eng: Part C vol. 17, No. 4, 2011 (10 pages).

Friedman, M. et al. "Advanced Corneal Cross-Linking System with Fluorescence Dosimetry", Journal of Ophthalmology, vol. 2012, Article ID 303459, dated May 7, 2012 (6 pages).

Gibson, Q. et al., "The Oxidation Of Reduced Flavin Mononucleotide By Molecular Oxygen," Biochem. J. (1962) 83, 368-377 (10 pages).

Givens et al. "A Photoactivated Diazpryruvoyl Cross-Linking Agent for Bonding Tissue Containing Type-I Collagen." Photochemistry and Photobiology. vol. 78, No. 1, 2003 (pp. 23-29).

Glenn J.V., et al., "Advanced Glycation End Product (AGE) Accumulation on Bruch's Membrane: Links to Age-Related RPE Dysfunction;" Investigative Ophthalmology & Visual Science, vol. 50, No. 1, pp. 441-451; Jan. 2009 (11 pages).

Hafezi F., et al., "Collagen Crosslinking with Ultraviolet-A and Hypoosmolar Riboflavin Solution in Thin Corneas," J. Catract Refract. Surg., vol. 35, No. 1, pp. 621-624; Apr. 2009 (4 pages).

Hitzenberger et al., "Birefringence Properties Of The Human Cornea Measured With Polarization Sensitive Optical Coherence Tomography," Bull. Soc. Beige Ophtalmol., 302, 153-168, 2006.

Holmstrom, B. et al., "Riboflavin As An Electron Donor In Photochemical Reactions," 1867-1871, Nov. 29, 1960 (5 pages).

IMEX, "KXL System: Crosslinking Para Cirugia Corneal Bibliografia Cientifica," Product Literature, Nov. 23, 2010 (24 pages).

Kamaev et al., "Photochemical Kinetics Of Corneal Cross-Linking With Riboflavin," Investigative Ophthalmology & Visual Science, Apr. 2012, vol. 53, No. 4, pp. 2360-2367 (8 pages).

Kampik D. et al., "Influence of Corneal Collagen Crosslinking With Riboflavin and Ultraviolet-A Irradiation on Excimer Laser Surgery," Investigative Opthalmology & Visual Science, vol. 51, No. 8, pp. 3929-3934; Aug. 2010 (6 pages).

Kanellopoulos, A. J., "Collagen Cross-linking in Early Keratoconus With Riboflavin in a Femtosecond Laser-created Pocket: Initial Clinical Results", Journal of Refractive Surgery, Aug. 18, 2009.

Kanellopoulos, A. J., "Keratoconus management: UV A-induced collagen cross-linking followed by a limited topo-guided surface excimer ablation," American Academy of Ophthalmology, 2006 (25 pages).

Kanellopoulos, A. J., "Ultraviolet A cornea collagen cross-linking, as a pre-treatment for surface excimer ablation in the management of keratoconus and post-LASIK ectasia," American Academy of Ophthalmology, 2005 (28 pages).

Kissner Anja, et al., "Pharmacological Modification of the Epithelial Permeability by Benzalkonium Chloride in UVNRiboflavin Corneal Collagen Cross-Linking," Current Eye Research 35(8), pp. 715-721; Mar. 2010 (7 pages).

Koller, T. et al., "Complication and failure rates after corneal crosslinking," Journal Cataract and refractive surgery, vol. 35, No. 8, Aug. 2009, pp. 1358-1362.

Krueger Ronald R., "Rapid VS Standard Collagen CXL with Equivalent Energy Dosing," presentation slides, (26 pages); available at http://www.slideshare.net/logen/krueger-kerekar-rapid-cross-linking (date unknown, prior to Nov. 9, 2009).

Li, C. et al. "Elastic Properties of Soft Tissue-Mimicking Phantoms Assessed by Combined Use of Laser Ultrasonics and Low Coherence Interferometry." Optics Express. vol. 19, No. 11, May 9, 2011 (pp. 10153-10163).

Li, C. et al. "Noncontact All-Optical Measurement of Corneal Elasticity." Optics Letters. vol. 37, No. 10, May 15, 2012 (pp. 1625-1627).

(56) References Cited

OTHER PUBLICATIONS

Li, P. et al. "In Vivo Microstructural and Microvascular Imaging of the Human Corneo-Scleral Limbus Using Optical Coherence Tomography." Biomedical Optics Express. Vol. 2, No. 11, Oct. 18, 2011 (pp. 3109-3118).
Marzouky, et al., Tensioactive-mediated Transepithelial Corneal Cross-linking-First Laboratory Report, European Ophthalmic Review, 2009, 3(2), pp. 67-70.
Massey, V., "Activation Of Molecular Oxygen By Flavins And Flavoproteins," The Journal of Biological Chemistry vol. 269, No. 36, Issue of Sep. 9, pp. 22459-22462, 1994 (4 pages).
Meek, K.M. et al. "The Cornea and Sclera", Collagen: Structure and Mechanics, Chapter 13, pp. 359-396, 2008 (38 pages).
Mi S., et al., "The adhesion of LASIK-like flaps in the cornea: effects of cross-linking, stromal fibroblasts and cytokine treatment," presented at British Society for Matrix Biology annual Meeting, Cardiff, UK, Sep. 8-9, 2008 (17 pages).
Muller L., et al., "The Specific Architecture of the Anterior Stroma Accounts for Maintenance of Corneal Curvature," Br. J. Opthalmol., vol. 85, pp. 437-443; Apr. 2001 (8 pages).
Mulroy L., et al., "Photochemical Keratodesmos for repair of Lamellar corneal Incisions;" Investigative Ophthalmology & Visual Science, vol. 41, No. 11, pp. 3335-3340; Oct. 2000 (6 pages).
O'Neil A.C., et al., "Microvascular Anastomosis Using a Photochemical Tissue Bonding Technique;" Lasers in Surgery and Medicine, vol. 39, Issue 9, pp. 716-722; Oct. 2007 (7 pages).
Pinelli R., et al., "C3-Riboflaving Treatments: Where Did We Come From? Where Are We Now?" Cataract & Refractive Surgery Today Europe, Summer 2007, pp. 36-46; Jun. 2007 (10 pages).
Pinelli, R. "Corneal Cross-Linking with Riboflavin: Entering a New Era in Ophthalmology." Ophthalmology Times Europe. vol. 2, No. 7, Sep. 1, 2006 (3 pages).
Pinelli, R., "Panel Discussion: Epithelium On/Off, Corneal abrasion for CCL contra", presented at the 3° International Congress of Corneal Cross Linking on Dec. 7-8, 2007 in Zurich (36 pages).
Ponce C., et al., "Central and Peripheral Corneal Thickness Measured with Optical Coherence Tomography, Scheimpflug Imaging, and Ultrasound Pachymetry in Normal, Keratoconus-suspect and Post-laser in situ Keratomileusis Eyes," J. Cataract Refract. Surgery, vol. 35, No. 6, pp. 1055-1062; Jun. 2009 (8 pages).
Proano C.E., et al., "Photochemical Keratodesmos for Bonding Corneal Incisions;" Investigative Ophthalmology & Visual Science, vol. 45, No. 7, pp. 2177-2181; Jul. 2004 (5 pages).
Randall, J. et al., "The Measurement and Intrepretation of Brillouin Scattering in the Lens of the Eye," The Royal Society, Abstract only, published 2013 [available online at http:// rspb.royalsocietypublishing.org/content/214/11971449.short] (1 page).
Reinstein, D. Z. et al. "Epithelial Thickness Profile as a Method to Evaluate the Effectiveness of Collagen Cross-Linking Treatment After Corneal Ectasis." Journal of Refractive Surgery. Vol. 27, No. 5, May 2011 (pp. 356-363). [Abstract only].
Reiss, S. et al., "Non-Invasive, ortsaufgeloeste Bestimmung von Gewebeeigenschaften derAugenlinse, Dichte undProteinkonzentration unter Anwendung der Brillouin-spektroskopie", Klin Monatsbl Augenheilkd, vol. 228, No. 12, pp. 1079-1085, Dec. 13, 2011 (7 pages).
Reiss, S. et al., "Spatially resolved Brillouin Spectroscopy to determine the rheological properties of the eye lens", Biomedical Optics Express, vol. 2, No. 8, p. 2144, Aug. 1, 2011 (1 page).
Rocha K., et al., "Comparative Study of Riboflavin-UVA Cross-linking and "Flash-linking" Using Surface Wave Elastometry," Journal of Refractive Surgery, vol. 24 Issue 7, pp. S748-S751; Sep. 2008 (4 pages).
Rolandi et al. Correlation of Collagen-Linked Fluorescence and Tendon Fiber Breaking Time. Gerontology 1991;27 :240-243 (4 pages).
Scarcelli, G. et al., "Brillouin Optical Microscopy for Corneal Biomechanics", Investigative Ophthalmology & Visual Science, Jan. 2012, vol. 53, No. 1, pp. 185-190 (6 pages).

Sheehan M., et al., "Illumination System for Corneal Collagen Crosslinking," Optometry and Vision Science, vol. 88, No. 4, pp. 512-524; Apr. 2011 (13 pages).
Spoerl E. et al., "Safety of UVA-Riboflavin Cross-Linking of the Cornea," Cornea, vol. 26, No. 4, pp. 385-389; May 2007 (5 pages).
Spoerl E., et al., "Artificial Stiffening of the Cornea by Induction of Intrastromal Cross-links," Oer Ophthalmologe, vol. 94, No. 12, pp. 902-906; Dec. 1997 (5 pages).
Spoerl E., et al., "Induction of Cross-links in Corneal Tissue," Experimental Eye Research, vol. 66, Issue 1, pp. 97-103; Jan. 1998 (7 pages).
Spoerl E., et al., "Techniques for Stiffening the Cornea," Journal of Refractive Surgery, vol. 15, Issue 6, pp. 711-713; Nov.-Dec. 1999 (4 pages).
Tessier FJ, et al., "Rigidification of Corneas Treated in vitro with Glyceraldehyde: Characterization of Two Novel Crosslinks and Two Chromophores," Investigative Opthalmology & Visual Science, vol. 43, E-Abstract; 2002 (2 pages).
Thorton, I. et al., "Biomechancial Effects of Intraocular Pressure Elevation on Optic Berve/Lamina Cribrosa before and after Peripapillary Scleral Collagen Cross-Linking." Invest. Ophthalmol. Vis. Sci., Mar. 2009, 50(3): pp. 1227-1233.
UV-X: Radiation System for Treatment of Keratokonus, PESCHKE Meditrade GmbH; retrieved from http://www.peschkemed.ch/ on Sep. 27, 2011 (1 page) (date unknown, prior to Sep. 16, 2008).
Vasan S., et al., "An agent cleaving glucose-derived protein crosslinks in vitro and in vivo;" Letters to Nature, vol. 382, pp. 275-278; Jul. 18, 1996 (4 pages).
Verzijl et al. Crosslinking by Advanced Glycation End Products Increases the Stiffness of the Collagen Network in Human Articular Cartilage. Arthritis & Rheumatism vol. 46, No. 1, Jan. 2002, pp. 114-123 (10 pages).
Wollensak G., "Crosslinking Treatment of Progressive Keratoconus: New Hope," Current Opinion in Ophthalmology, vol. 17(4), pp. 356-360; Aug. 2006 (5 pages).
Wollensak G., et al., "Biomechanical and Histological Changes After Corneal Crosslinking With and Without Epithelial Debridement," J. Cataract Refract. Surg., vol. 35, Issue 3, pp. 540-546; Mar. 2009 (7 pages).
Wollensak G., et al., "Collagen Crosslinking of Human and Porcine Sclera," J. Cataract Refract. Surg., vol. 30, Issue 3, pp. 689-695; Mar. 2004 (7 pages).
Wollensak G., et al., "Cross-linking of Scleral Collagen in the Rabbit Using Riboflavin and UVA," Acta Ophtalmologica Scandinavica, vol. 83(4), pp. 477-482; Aug. 2005 (6 pages).
Wollensak G., et al., "Hydration Behavior of Porcine Cornea Crosslinked with Riboflavin and Ultraviolet," A.J. Cataract Refract. Surg., vol. 33, Issue 3, pp. 516-521; Mar. 2007 (6 pages).
Wollensak G., et al., "Riboflavin/Ultraviolet-A-induced Collagen Crosslinking for the Treatment of Keratoconus," American Journal of Ophthalmology, vol. 135, No. 5, pp. 620-627; May 2003 (8 pages).
Wollensak, G. et al. "Laboratory Science: Stress-Strain Measurements of Human and Porcine Corneas after Riboflavin-Ultraviolet-A-Induced Cross-Linking." Journal of Cataract and Refractive Surgery. vol. 29, No. 9, Sep. 2003 (pp. 1780-1785).
Wong, J. et al., "Post-Lasik ectasia: PRK following previous stablization and effective management with Riboflavin I ultraviolet A-induced collagen cross-linking," Association for Research in Vision and Ophthalmology, 2006 (1 page).
Yang H., et al., "3-D Histomorphometry of the Normal and Early Glaucomatous Monkey Optic Nerve Head: Lamina Cribrosa and Peripapillary Scleral Position and Thickness," Investigative Ophthalmology & Visual Science, vol. 48, No. 10, pp. 4597-4607; Oct. 2007 (11 pages).
Yang N., Oster G. Dye-sensitized photopolymerization in the presence of reversible oxygen carriers. J. Phys. Chem. 74, 856-860 (1970).
Zhang, Y. et al., "Effects of Ultraviolet-A and Riboflavin on the Interaction of Collagen and Proteoglycans during Corneal Crosslinking", Journal of Biological Chemistry, vol. 286, No. 15, dated Apr. 5, 2011 (pp. 13011-13022).

(56) References Cited

OTHER PUBLICATIONS

International Patent Application No. PCT/US2019/051876, International Search Report, Dec. 19, 2019 (2 pages).
International Patent Application No. PCT/US2019/051876, Written Opinion of the ISA, Dec. 19, 2019 (3 pages).
Extended European Search Report for related European Application No. 19861900.9; action dated May 11, 2022; (7 pages).
Office Action for related Japanese Application No. 2021-515067; action dated Nov. 1, 2022; (9 pages).
Chinese Office Action from corresponding Chinese Patent Application No. 201980068841.7, mailed Feb. 13, 2023.
Seiler et al, "Customer Corneal Cross linking: One Year Results ", American Journal of Ophthalmology, p. 14 20, Jun. 2016.
Notification of Reasons for Rejection for Japanese Patent Application No. 2021-515067 dated Mar. 23, 2023.
Notification of Reasons for Rejection and English Translation from corresponding Japanese Patent Application No. 2021-515067, dated Dec. 5, 2023. 5 pages.
Australian Examination Report No. 1 for corresponding Australian Patent Application No. 2019345061, mailed May 6, 2024. 3 pages.

\* cited by examiner

SYSTEMS AND METHODS TREATING FOR CORNEAL ECTATIC DISORDERS

CROSS-REFERENCE TO RELATED APPLICATIONS

This application claims the benefit of, and priority to, U.S. Provisional Patent Application No. 62/733,617, filed Sep. 19, 2018, the contents of which are incorporated entirely herein by reference.

BACKGROUND

Field

The present disclosure pertains to systems and methods for eye treatments, and more particularly, to systems and methods for treating corneal ectatic disorders.

Description of Related Art

Corneal ectatic disorders, or corneal ectasia, are a group of uncommon, noninflammatory, eye disorders characterised by bilateral thinning of the central, paracentral, or peripheral cornea.

For instance, keratoconus is a degenerative disorder of the eye in which structural changes within the cornea cause it to weaken and change to an abnormal conical shape. Cross-linking treatments can strengthen and stabilize areas weakened by keratoconus and prevent undesired shape changes.

For instance, a complication known as post-LASIK ectasia may occur due to the thinning and weakening of the cornea caused by Laser-Assisted in situ Keratomileusis surgery (LASIK) surgery. In post-LASIK ectasia, the cornea experiences progressive steepening (bulging). Accordingly, cross-linking treatments can strengthen and stabilize the structure of the cornea after LASIK surgery and prevent post-LASIK ectasia.

SUMMARY

To treat corneal ectatic disorders, such as keratoconus, systems and methods can precisely apply photoactivating light to specified areas of a cornea treated with a cross-linking agent.

An example system for treating an eye includes a light source configured to provide a photoactivating light that photoactivates a cross-linking agent applied to an eye. The system includes one or more optical elements configured to receive the photoactivating light and transmit the photoactivating light to the eye according to a pattern defined by a plurality of treatment zones. The treatment zones are delivered to different respective areas on the eye. The plurality of treatment zones includes at least a first treatment zone and a second treatment zone. The first treatment zone provides a first dose of the photoactivating light. The second treatment zone provides a second dose of the photoactivating light. The first dose is greater than the second dose. The first treatment zone is disposed within an inner boundary of the second treatment zone.

An example method for treating an eye includes determining a location of a treatment area on the eye. The method includes operating at least one of a light source for photoactivating light or one or more optical elements coupled to the light source to deliver a pattern of photoactivating light according to the location of the treatment area. The photoactivating light photoactivates a cross-linking agent applied to the eye. The pattern of photoactivating light is defined by a plurality of treatment zones. The treatment zones are delivered to different respective areas on the eye. The plurality of treatment zones includes at least a first treatment zone and a second treatment zone. The first treatment zone provides a first dose of the photoactivating light. The second treatment zone provides a second dose of the photoactivating light. The first dose is greater than the second dose. The first treatment zone is disposed within an inner boundary of the second treatment zone. In some cases, the treatment area may correspond to an ectatic cone in the cornea, and at least one of the light source or the one or more optical elements is operated to deliver the first treatment zone to the ectatic cone and to deliver the second treatment zone to areas of the cornea outside the ectatic cone. In further cases, the plurality of treatment zones may include a third treatment zone providing a third dose of the photoactivating light, the third dose being greater than the first dose, the third treatment zone being disposed within an inner boundary of the first treatment zone, and at least one of the light source or the one or more optical elements is operated to deliver the first treatment zone and the third treatment zone to the ectatic cone and to deliver the second treatment zone of the photoactivating light to areas of the cornea outside the ectatic cone.

While the present disclosure is susceptible to various modifications and alternative forms, a specific embodiment thereof has been shown by way of example in the drawings and will herein be described in detail. It should be understood, however, that it is not intended to limit the present disclosure to the particular forms disclosed, but on the contrary, the intention is to cover all modifications, equivalents, and alternatives falling within the spirit of the present disclosure.

DESCRIPTION

Figure 1:
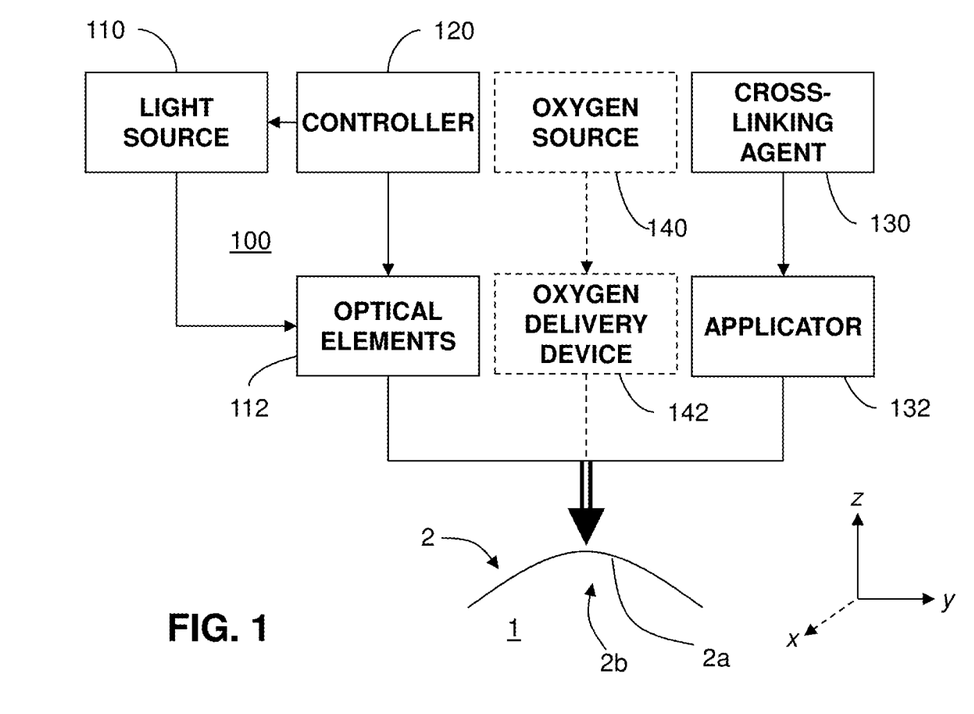
FIG. 1 illustrates an example system that delivers a cross-linking agent and photoactivating light to a cornea of an eye in order to generate cross-linking of corneal collagen, according to aspects of the present disclosure.

FIG. 1 illustrates an example treatment system 100 for generating cross-linking of collagen in a cornea 2 of an eye 1. The treatment system 100 includes an applicator 132 for applying a cross-linking agent 130 to the cornea 2. In example embodiments, the applicator 132 may be an eye dropper, syringe, or the like that applies the photosensitizer 130 as drops to the cornea 2. Example systems and methods for applying the cross-linking agent are described in U.S. Pat. No. 10,342,697, filed Apr. 13, 2017 and titled "Systems and Methods for Delivering Drugs to an Eye," the contents of which are incorporated entirely herein by reference.

The cross-linking agent 130 may be provided in a formulation that allows the cross-linking agent 130 to pass through the corneal epithelium 2a and to underlying regions in the corneal stroma 2b. Alternatively, the corneal epithelium 2a may be removed or otherwise incised to allow the cross-linking agent 130 to be applied more directly to the underlying tissue.

The treatment system 100 includes an illumination system with a light source 110 and optical elements 112 for directing light to the cornea 2. The light causes photoactivation of the cross-linking agent 130 to generate cross-linking activity in the cornea 2. For example, the cross-linking agent may include riboflavin and the photoactivating light may include ultraviolet A (UVA) (e.g., approximately 365 nm) light. Alternatively, the photoactivating light may include another wavelength, such as a visible wavelength (e.g., approximately 452 nm). As described further below, corneal cross-linking improves corneal strength by creating chemical bonds within the corneal tissue according to a system of photochemical kinetic reactions. For instance, riboflavin and the photoactivating light may be applied to stabilize and/or strengthen corneal tissue to address corneal ectatic disorders, such as keratoconus or post-LASIK ectasia. Additionally, the application of riboflavin and the photoactivating light may to allow for various amounts of refractive correction, which for instance, may involve combinations of myopia, hyperopia, astigmatism, irregular astigmatism, presbyopia and complex corneal refractive surface corrections due to corneal ectatic disorders as well as other conditions of corneal biomechanical alteration/degeneration, etc.

The treatment system 100 includes one or more controllers 120 that control aspects of the system 100, including the light source 110 and/or the optical elements 112. In an implementation, the cornea 2 can be more broadly treated with the cross-linking agent 130 (e.g., with an eye dropper, syringe, etc.), and the photoactivating light from the light source 110 can be selectively directed to regions of the treated cornea 2 according to a particular pattern.

The optical elements 112 may include one or more mirrors or lenses for directing and focusing the photoactivating light emitted by the light source 110 to a particular pattern on the cornea 2. The optical elements 112 may further include filters for partially blocking wavelengths of light emitted by the light source 110 and for selecting particular wavelengths of light to be directed to the cornea 2 for photoactivating the cross-linking agent 130. In addition, the optical elements 112 may include one or more beam splitters for dividing a beam of light emitted by the light source 110, and may include one or more heat sinks for absorbing light emitted by the light source 110. The optical elements 112 may also accurately and precisely focus the photoactivating light to particular focal planes within the cornea 2, e.g., at a particular depths in the underlying region 2b where cross-linking activity is desired.

Moreover, specific regimes of the photoactivating light can be modulated to achieve a desired degree of cross-linking in the selected regions of the cornea 2. The one or more controllers 120 may be used to control the operation of the light source 110 and/or the optical elements 112 to precisely deliver the photoactivating light according to any combination of: wavelength, bandwidth, intensity, power, location, depth of penetration, and/or duration of treatment (the duration of the exposure cycle, the dark cycle, and the ratio of the exposure cycle to the dark cycle duration).

The parameters for photoactivation of the cross-linking agent 130 can be adjusted, for example, to reduce the amount of time required to achieve the desired cross-linking. In an example implementation, the time can be reduced from minutes to seconds. While some configurations may apply the photoactivating light at an irradiance of 5 mW/cm$^2$, larger irradiance of the photoactivating light, e.g., multiples of 5 mW/cm$^2$, can be applied to reduce the time required to achieve the desired cross-linking. The total dose of energy absorbed in the cornea 2 can be described as an effective dose, which is an amount of energy absorbed through an area of the corneal epithelium 2a. For example the effective dose for a region of the corneal surface 2A can be, for example, approximately 5 J/cm$^2$, or as high as approximately 20 J/cm$^2$ or approximately 30 J/cm$^2$. The effective dose described can be delivered from a single application of energy, or from repeated applications of energy.

The optical elements 112 of the treatment system 100 may include a microelectromechanical system (MEMS) device, e.g., a digital micro-mirror device (DMD), to modulate the application of photoactivating light spatially and temporally. Using DMD technology, the photoactivating light from the light source 110 is projected in a precise spatial pattern that is created by microscopically small mirrors laid out in an array on a semiconductor chip. Each mirror represents one or more pixels in the pattern of projected light. With the DMD one can perform topography guided cross-linking. The control of the DMD according to topography may employ several different spatial and temporal irradiance and dose profiles. These spatial and temporal dose profiles may be created using continuous wave illumination but may also be modulated via pulsed illumination by pulsing the illumination source under varying frequency and duty cycle regimes. Alternatively, the DMD can modulate different frequencies and duty cycles on a pixel by pixel basis to give ultimate flexibility using continuous wave illumination. Or alternatively, both pulsed illumination and modulated DMD frequency and duty cycle combinations may be combined. This allows for specific amounts of spatially determined corneal cross-linking. This spatially determined cross-linking may be combined with dosimetry, interferometry, optical coherence tomography (OCT), corneal topography, etc., for pre-treatment planning and/or real-time monitoring and modulation of corneal cross-linking during treatment. Aspects of a dosimetry system are described in further detail below. Additionally, pre-clinical patient information may be combined with finite element biomechanical computer modeling to create patient specific pre-treatment plans.

To control aspects of the delivery of the photoactivating light, embodiments may also employ aspects of multiphoton excitation microscopy. In particular, rather than delivering a single photon of a particular wavelength to the cornea 2, the treatment system 100 may deliver multiple photons of longer wavelengths, i.e., lower energy, that combine to initiate the cross-linking. Advantageously, longer wavelengths are scattered within the cornea 2 to a lesser degree than shorter wavelengths, which allows longer wavelengths of light to penetrate the cornea 2 more efficiently than light of shorter wavelengths. Shielding effects of incident irradiation at deeper depths within the cornea are also reduced over conventional short wavelength illumination since the absorption of the light by the photosensitizer is much less at the longer wavelengths. This allows for enhanced control over depth specific cross-linking. For example, in some embodiments, two photons may be employed, where each photon carries approximately half the energy necessary to excite the molecules in the cross-linking agent 130 to generate the photochemical kinetic reactions described further below. When a cross-linking agent molecule simultaneously absorbs both photons, it absorbs enough energy to release reactive radicals in the corneal tissue. Embodiments may also utilize lower energy photons such that a cross-linking agent molecule must simultaneously absorb, for example, three, four, or five, photons to release a reactive radical. The probability of the near-simultaneous absorption of multiple photons is low, so a high flux of excitation photons may be required, and the high flux may be delivered through a femtosecond laser.

A large number of conditions and parameters affect the cross-linking of corneal collagen with the cross-linking agent 130. For example, the irradiance and the dose of photoactivating light affect the amount and the rate of cross-linking.

When the cross-linking agent 130 is riboflavin in particular, the UVA light may be applied continuously (continuous wave (CW)) or as pulsed light, and this selection has an effect on the amount, the rate, and the extent of cross-linking. If the UVA light is applied as pulsed light, the duration of the exposure cycle, the dark cycle, and the ratio of the exposure cycle to the dark cycle duration have an effect on the resulting corneal stiffening. Pulsed light illumination can be used to create greater or lesser stiffening of corneal tissue than may be achieved with continuous wave illumination for the same amount or dose of energy delivered. Light pulses of suitable length and frequency may be used to achieve more optimal chemical amplification. For pulsed light treatment, the on/off duty cycle may be between approximately 1000/1 to approximately 1/1000; the irradiance may be between approximately 1 mW/cm$^2$ to approximately 1000 mW/cm$^2$ average irradiance, and the pulse rate may be between approximately 0.01 HZ to approximately 1000 Hz or between approximately 1000 Hz to approximately 100,000 Hz.

The treatment system 100 may generate pulsed light by employing a DMD, electronically turning the light source 110 on and off, and/or using a mechanical or opto-electronic (e.g., Pockels cells) shutter or mechanical chopper or rotating aperture. Because of the pixel specific modulation capabilities of the DMD and the subsequent stiffness impartment based on the modulated frequency, duty cycle, irradiance and dose delivered to the cornea, complex biomechanical stiffness patterns may be imparted to the cornea. A specific advantage of the DMD system and method is that it allows for randomized asynchronous pulsed topographic patterning, creating a non-periodic and uniformly appearing illumination which eliminates the possibility for triggering photosensitive epileptic seizures or flicker vertigo for pulsed frequencies between 2 Hz and 84 Hz.

Although example embodiments may employ stepwise on/off pulsed light functions, it is understood that other functions for applying light to the cornea may be employed to achieve similar effects. For example, light may be applied to the cornea according to a sinusoidal function, sawtooth function, or other complex functions or curves, or any combination of functions or curves. Indeed, it is understood that the function may be substantially stepwise where there may be more gradual transitions between on/off values. In addition, it is understood that irradiance does not have to decrease down to a value of zero during the off cycle, and may be above zero during the off cycle. Desired effects may be achieved by applying light to the cornea according to a curve varying irradiance between two or more values.

Examples of systems and methods for delivering photoactivating light are described, for example, in U.S. Patent Application Publication No. 2011/0237999, filed Mar. 18, 2011 and titled "Systems and Methods for Applying and Monitoring Eye Therapy," U.S. Patent Application Publication No. 2012/0215155, filed Apr. 3, 2012 and titled "Systems and Methods for Applying and Monitoring Eye Therapy," and U.S. Patent Application Publication No. 2013/0245536, filed Mar. 15, 2013 and titled "Systems and Methods for Corneal Cross-Linking with Pulsed Light," the contents of these applications being incorporated entirely herein by reference. Embodiments may generate cross-linking activity in the cornea according to circular and/or annular patterns defined by the delivery of photoactivating light (e.g., via the DMD described above). Additionally or alternatively, embodiments may generate cross-linking activity in the cornea according to non-circular and/or non-annular patterns defined by the delivery of photoactivating light (e.g., via the DMD).

Patterns of photoactivating light can be applied (e.g., via the DMD) to the eye in separate treatment zones with different doses sequentially or continuously applied. For instance, one treatment zone can be "turned off" (i.e., delivery of the corresponding photoactivating light ceases) while another "stays on" (i.e., delivery of the corresponding photoactivating light continues). The treatment zones can be, for instance, annularly shaped about a center point of the eye. There may also be discontinuous zones where no the photoactivating light is applied (e.g., a central treatment zone surrounded by an annulus of no light surrounded by an annular treatment zone of light, etc.). The widths of the annular zones can be of different dimensions, e.g., one annular zone has a width of 1 mm and another has a width of 2 mm. Applying the photoactivating light in annular treatment zones on the periphery of the eye without a central treatment zone can result in a hyperopic correction, for instance, by causing the central region of the eye to have an increased curvature while the periphery is strengthened. In some cases, central and surrounding treatment zones can be elliptical in shape, for instance to address astigmatism, by preferentially generating cross-linking activity in regions of the cornea to correct the astigmatism. Such elliptically shaped annular treatment zones are preferentially oriented with the axis of the annular treatment zones aligned according to the orientation of the astigmatism. The elliptically shaped treatment zones can also be irregularly asymmetric (i.e., having major and minor axis that are not perpendicular and can be situated with distinct center points (centers of mass)).

Cross-linking treatments can be tuned according to one or more biomechanical properties of the eye, such as the corneal topography (i.e., shape), corneal strength (i.e., stiffness), and/or corneal thickness. Optical correction and/or strengthening of the cornea can be achieved by applying the cross-linking agent and/or photoactivating light in one or more iterations with adjustable characteristics for each iteration. Generally, a developed treatment plan can include a number of applications of the cross-linking agent, the amount and concentration of the cross-linking agent for each application, the number of applications of photoactivating light, and the timing, duration, power, energy dosage, and pattern of the photoactivating light for each application. Furthermore, the cross-linking treatments can be adapted based on feedback information relating to the biomechanical properties gathered in real-time during treatment or during breaks in treatments.

The addition of oxygen also affects the amount of corneal stiffening. In human tissue, $O_2$ content is very low compared to the atmosphere. The rate of cross-linking in the cornea, however, is related to the concentration of $O_2$ when it is irradiated with photoactivating light. Therefore, it may be advantageous to increase or decrease the concentration of $O_2$ actively during irradiation to control the rate of cross-linking until a desired amount of cross-linking is achieved. Oxygen may be applied during the cross-linking treatments in a number of different ways. One approach involves supersaturating the riboflavin with $O_2$. Thus, when the riboflavin is applied to the eye, a higher concentration of $O_2$ is delivered directly into the cornea with the riboflavin and affects the reactions involving $O_2$ when the riboflavin is exposed to the photoactivating light. According to another approach, a steady state of $O_2$ (at a selected concentration) may be maintained at the surface of the cornea to expose the cornea to a selected amount of $O_2$ and cause $O_2$ to enter the cornea. As shown in FIG. 1, for instance, the treatment system 100 also includes an oxygen source 140 and an oxygen delivery device 142 that optionally delivers oxygen at a selected concentration to the cornea 2. Example systems and methods for applying oxygen during cross-linking treatments are described, for example, in U.S. Pat. No. 8,574,277, filed Oct. 21, 2010 and titled "Eye Therapy," U.S. Pat. No. 9,707,126, filed Oct. 31, 2012 and titled "Systems and Methods for Corneal Cross-Linking with Pulsed Light," the contents of these applications being incorporated entirely herein by reference. Additionally, an example mask device for delivering concentrations of oxygen as well as photoactivating light in eye treatments is described in U.S. Provisional Patent Application Publication No. 2017/0156926, filed Dec. 3, 2016 and titled "Systems and Methods for Treating an Eye with a Mask Device," the contents of which are incorporated entirely herein by reference. For instance, a mask may be placed over the eye(s) to produce a consistent and known oxygen concentration above the surface.

When riboflavin absorbs radiant energy, especially light, it undergoes photoactivation. There are two photochemical kinetic pathways for riboflavin photoactivation, Type I and Type II. The reactions involved in both the Type I and Type II mechanisms and other aspects of the photochemical kinetic reactions generating cross-linking activity are described in U.S. Pat. No. 10,350,111, filed Apr. 27, 2016 and titled "Systems and Methods for Cross-Linking Treatments of an Eye," the contents of which are incorporated entirely herein by reference.

Figure 2:
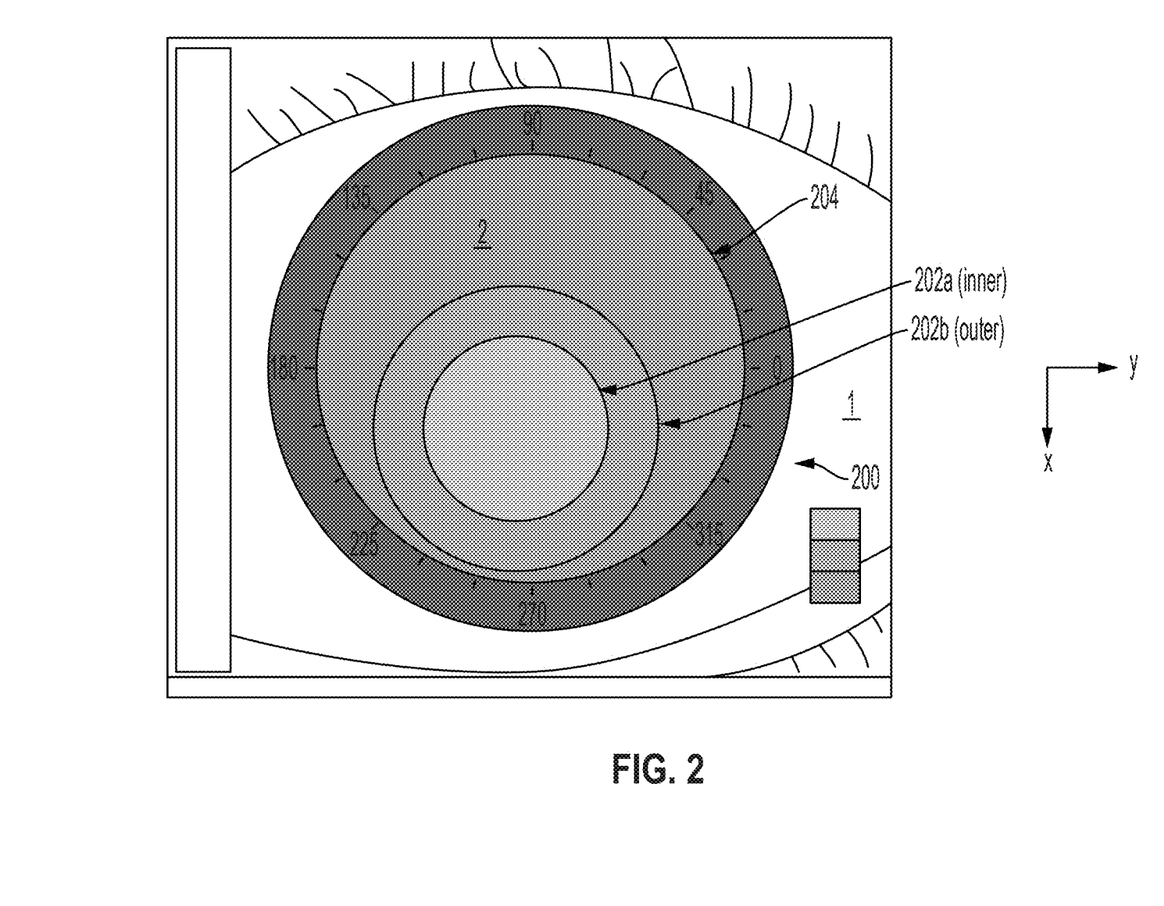
FIG. 2 illustrates an example pattern of photoactivating light that can be applied to treat corneal ectatic disorders, according to aspects of the present disclosure.

To treat corneal ectatic disorders, such as keratoconus, an effective cross-linking procedure precisely applies photoactivating light to specified areas of a cornea treated with a cross-linking agent. For instance, FIG. 2 illustrates an example pattern 200 of photoactivating light that can be applied to treat corneal ectatic disorders associated with the cornea 2 of the eye 1. As described above, UV light may be delivered according to the pattern 200 to photoactivate a cross-linking agent, such as riboflavin, which has been applied to the cornea 2. As shown, the pattern 200 includes higher-dose treatment zones 202a, b and a lower-dose treatment zone 204. The higher-dose treatment zones 202a, b provide more energy via the photoactivating light than the lower-dose treatment zone 204.

The higher-dose treatment zones 202a, b are centered on and cover the extent of an ectatic cone caused by a disorder, such as keratoconus. As such, the higher-dose treatment zones 202a, b can reduce a curvature of (i.e., flatten) the ectatic cone. The location of the ectatic cone can be determined, for instance, by evaluating the topography, tomography, and/or pachymetry of the cornea 2. As shown in FIG. 2, the higher-dose treatment zone 202a is concentrically disposed within the higher-dose treatment zone 202b. The inner higher-dose treatment zone 202a provides a dose of approximately 10.5 $J/cm^2$ and the outer higher-dose treatment zone 202b provides a dose of approximately 8.5 $J/cm^2$.

Meanwhile, the lower-dose treatment zone 204 extends from the outer edge of the higher-dose treatment zones 202a, b and covers the surrounding areas of the cornea, where the outer edge of the lower-dose treatment zone 204 does not extend over the limbus. As such, the lower-dose treatment zone 204 stabilizes the surrounding non-ectatic cornea. As shown in FIG. 2, the lower-dose treatment zone 204 is greater than zero and provides a dose of approximately 5.4 $J/cm^2$. In some aspects, other approaches teach away from using the lower-dose treatment zone 204 in the pattern 200, as it has been believed that the application of photoactivating light to areas outside the ectatic cone might have an undesired effect on the efficacy of the photoactivating light applied to ectatic cone, e.g., prevent the desired flattening of the ectatic cone.

The shape of the pattern 200 along the x-y plane shown in FIG. 2 can be achieved by adjusting aspects of the optical elements 112 as described above. For instance, the DMD may be programmed via the controller 120 to define the higher-dose treatment zones 202a, b and the lower-dose treatment zone 204 as different respective pixelated shapes applied to the cornea 2. Meanwhile, the depth along the z-axis for delivery of the photoactivating light can be achieved by adjusting the irradiance of the photoactivating light.

Figure 3:
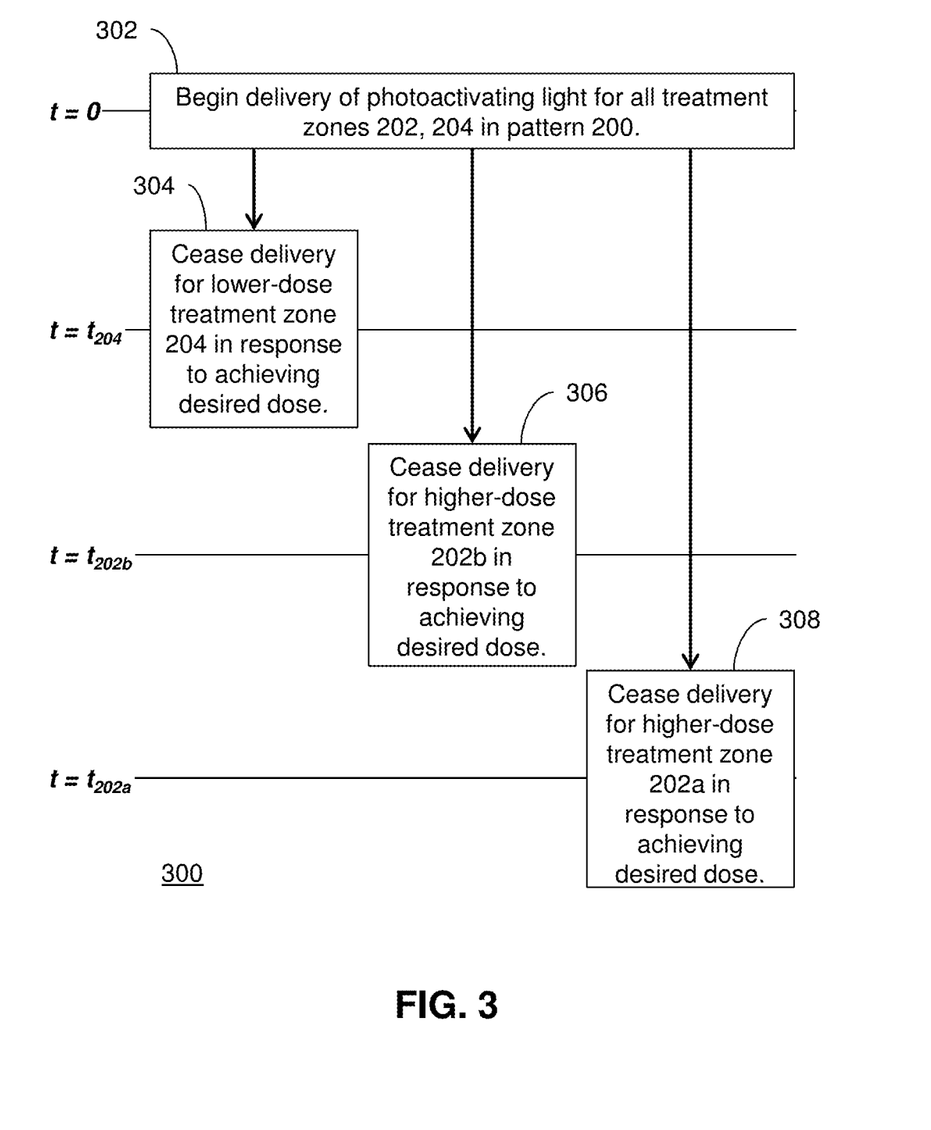
FIG. 3 illustrates an example method for applying the pattern of FIG. 2 to treat corneal ectatic disorders, according to aspects of the present disclosure.

FIG. 3 illustrates an example method 300 for applying the photoactivating light according to the pattern 200. At time t=0, delivery of the photoactivating light for all treatment zones 202a, b, 204 is initiated substantially simultaneously in act 302. At time $t=t_{204}$, delivery of the photoactivating light for the lower treatment zone 204 ceases in act 304 as the desired lower dose, e.g., approximately 5.4 $J/cm^2$, is achieved. At time $t=t_{202b}$, delivery of the photoactivating light for the outer higher-dose treatment zone 202b ceases in subsequent act 306 as the desired higher dose, e.g., approximately 8.5 $J/cm^2$, is achieved. At time $t=t_{202a}$, delivery of the photoactivating light for the inner higher-dose treatment zone 202a ceases in subsequent act 308 as the desired higher dose, e.g., approximately 10.5 $J/cm^2$, is achieved.

Although the example pattern 200 shown in FIG. 2 may include the two higher-dose treatment zones 202a, b, other patterns may include only one higher-dose treatment zone. (As shown in FIG. 2, for instance, equal doses can be provided in the treatment zones 202a, b.) Alternatively, other patterns may include more than two higher-dose treatment zones. Although the example pattern 200 shown in FIG. 2 may include one lower-dose treatment zone 204, other patterns may include more than one lower-dose treatment zone outside the ectatic cone.

It is also understood that the treatment zones may be located and/or shaped differently than shown in FIG. 2. For instance, the treatment zones may elliptically shaped. Furthermore, although the treatment zones 202a, b, 204 may provide the specified doses described above, other patterns may provide different doses in respective treatment zones. In addition, the relationship of doses between the different treatment zones may be different from those shown in FIG. 2. For instance, the dose(s) provided outside the ectatic cone may be higher than the dose(s) provided for the ectatic cone.

As described above, according to some aspects of the present disclosure, some or all of the steps of the above-described and illustrated procedures can be automated or guided under the control of a controller (e.g., the controller 120). Generally, the controllers may be implemented as a combination of hardware and software elements. The hardware aspects may include combinations of operatively coupled hardware components including microprocessors, logical circuitry, communication/networking ports, digital filters, memory, or logical circuitry. The controller may be adapted to perform operations specified by a computer-executable code, which may be stored on a computer readable medium.

As described above, the controller may be a programmable processing device, such as an external conventional computer or an on-board field programmable gate array (FPGA) or digital signal processor (DSP), that executes software, or stored program instructions. In general, physical processors and/or machines employed by embodiments of the present disclosure for any processing or evaluation may include one or more networked or non-networked general purpose computer systems, microprocessors, field programmable gate arrays (FPGA's), digital signal processors (DSP's), micro-controllers, and the like, programmed according to the teachings of the example embodiments of the present disclosure, as is appreciated by those skilled in the computer and software arts. The physical processors and/or machines may be externally networked with the image capture device(s), or may be integrated to reside within the image capture device. Appropriate software can be readily prepared by programmers of ordinary skill based on the teachings of the example embodiments, as is appreciated by those skilled in the software art. In addition, the devices and subsystems of the example embodiments can be implemented by the preparation of application-specific integrated circuits or by interconnecting an appropriate network of conventional component circuits, as is appreciated by those skilled in the electrical art(s). Thus, the example embodiments are not limited to any specific combination of hardware circuitry and/or software.

Stored on any one or on a combination of computer readable media, the example embodiments of the present disclosure may include software, or stored program instructions, for controlling the devices and subsystems of the example embodiments, for driving the devices and subsystems of the example embodiments, for enabling the devices and subsystems of the example embodiments to interact with a human user, and the like. Such software can include, but is not limited to, device drivers, firmware, operating systems, development tools, applications software, and the like. Such computer readable media further can include the computer program product of an embodiment of the present disclosure for performing all or a portion (if processing is distributed) of the processing performed in implementations. Computer code devices of the example embodiments of the present disclosure can include any suitable interpretable or executable code mechanism, including but not limited to scripts, interpretable programs, dynamic link libraries (DLLs), Java classes and applets, complete executable programs, and the like. Moreover, parts of the processing of the example embodiments of the present disclosure can be distributed for better performance, reliability, cost, and the like.

Common forms of computer-readable media may include, for example, a floppy disk, a flexible disk, hard disk, magnetic tape, any other suitable magnetic medium, a CD-ROM, CDRW, DVD, any other suitable optical medium, punch cards, paper tape, optical mark sheets, any other suitable physical medium with patterns of holes or other optically recognizable indicia, a RAM, a PROM, an EPROM, a FLASH-EPROM, any other suitable memory chip or cartridge, a carrier wave or any other suitable medium from which a computer can read.

While the present disclosure has been described with reference to one or more particular embodiments, those skilled in the art will recognize that many changes may be made thereto without departing from the spirit and scope of the present disclosure. Each of these embodiments and obvious variations thereof is contemplated as falling within the spirit and scope of the present disclosure. It is also contemplated that additional embodiments according to aspects of the present disclosure may combine any number of features from any of the embodiments described herein.

What is claimed is:

1. A system for treating an eye, comprising:
a light source configured to provide a photoactivating light that photoactivates a cross-linking agent applied to an eye, the light source further configured to pulse the photoactivating light at a pulse rate between approximately 1,000 Hz to 100,000 Hz;
an oxygen delivery device configured to provide a concentration of oxygen from an oxygen source to a cornea of the eye;
one or more optical elements configured to receive the photoactivating light and transmit the photoactivating light to the eye according to a pattern defined by a plurality of treatment zones; and
a controller including one or more processors configured to execute program instructions stored on a one or more computer-readable media, the program instructions causing the one or more processors to determine a location of the plurality of treatment zones and to control at least one of the light source and the one or more optical elements to deliver the pattern of photoactivating light according to the location of the plurality of treatment zones,
wherein the treatment zones are delivered to different respective areas on the eye, the plurality of treatment zones include at least a first treatment zone and a second treatment zone, the at least first treatment zone and the second treatment zone collectively encompassing an entire surface of the cornea of the eye, the first treatment zone configured to provide a first dose of the photoactivating light to a center of an ectatic cone for a first treatment time, the second treatment zone configured to provide a second dose of the photoactivating light offset from the center of the ectatic cone for a second treatment time, the first dose being less than the second dose, and the first treatment zone being disposed within an inner boundary of the second treatment zone, and
wherein the one or more processors control at least one of the light source and the one or more optical elements to deliver the first dose of the photoactivating light as the first treatment zone to the ectatic cone and to deliver the second dose of the photoactivating light as the second treatment zone to areas of the cornea outside the ectatic cone.

2. The system of claim 1, wherein the plurality of treatment zones includes a third treatment zone providing a third dose of the photoactivating light, the third dose being greater than the first dose, and the third treatment zone being disposed within an inner boundary of the first treatment zone.

3. The system of claim 1, wherein the program instructions cause the one or more processors to determine the location of the plurality of treatment zones on the cornea based on information associated with at least one of topography, tomography, or pachymetry of a cornea.

4. The system of claim 1, wherein the plurality of treatment zones includes a third treatment zone providing a third dose of the photoactivating light, the third dose being greater than the first dose, the third treatment zone being disposed within an inner boundary of the first treatment zone, and the one or more processors control at least one of the light source and the one or more optical elements to deliver the first dose of the photoactivating light as the first treatment zone and the third dose of the photoactivating light as the third treatment zone to the ectatic cone and to deliver the second dose of the photoactivating light as the second treatment zone to areas of the cornea outside the ectatic cone.

5. The system of claim 1, wherein at least one of the light source and the one or more optical elements are configured to deliver the first dose of the photoactivating light and the second dose of the photoactivating light by:
simultaneously initiating delivery of the first treatment zone and the second treatment zone to the eye,
ceasing delivery of the second treatment zone after the second dose has been delivered, and
ceasing delivery of the first treatment zone after the first dose has been delivered, wherein the delivery of the second treatment zone ceases before the delivery of the first treatment zone ceases.

6. The system of claim 1, wherein at least one of the light source and the one or more optical elements are configured to deliver the photoactivating light to one or more depths along an axis extending under a surface of the eye by adjusting an irradiance of the photoactivating light in each of the plurality of treatment zones, and the pattern of photoactivating light is defined along a plane transverse to the axis.

7. A method for treating an eye, comprising:
determining a location of a treatment area on the eye;
providing a concentration of oxygen from an oxygen source to a cornea of the eye; and
operating at least one of a light source for photoactivating light or one or more optical elements coupled to the light source to deliver a pattern of photoactivating light according to the location of the treatment area, the light source further configured to pulse the photoactivating light at a pulse rate between approximately 1,000 Hz to 100,000 Hz, the photoactivating light photoactivating a cross-linking agent applied to the eye, the pattern of photoactivating light defined by a plurality of treatment zones, the treatment zones being delivered to different respective areas on the eye, the plurality of treatment zones including at least a first treatment zone and a second treatment zone, the at least first treatment zone and the second treatment zone collectively encompassing an entire surface of a cornea of the eye, the first treatment zone configured to provide a first dose of the photoactivating light to a center of an ectatic cone for a first treatment time, the second treatment zone configured to provide a second dose of the photoactivating light offset from the center of the ectatic cone for a second treatment time, the first dose being less than the second dose, and the first treatment zone being disposed within an inner boundary of the second treatment zone.

8. The method of claim 7, wherein the plurality of treatment zones includes a third treatment zone providing a third dose of the photoactivating light, the third dose being greater than the first dose, the third treatment zone being disposed within an inner boundary of the first treatment zone.

9. The method of claim 7, wherein determining a location of a treatment area on the eye includes determining the location of the treatment area on the cornea based on information associated with at least one of topography, tomography, or pachymetry of the cornea.

10. The method of claim 7, wherein at least one of the light source and the one or more optical elements is operated to deliver the first dose of the photoactivating light as the first treatment zone to the ectatic cone and to deliver the second dose of the photoactivating light as the second treatment zone to areas of the cornea outside the ectatic cone.

11. The method of claim 10, wherein the plurality of treatment zones includes a third treatment zone providing a third dose of the photoactivating light, the third dose being greater than the first dose, the third treatment zone being disposed within an inner boundary of the first treatment zone, and at least one of the light source and the one or more optical elements is operated to deliver the first dose of the photoactivating light as the first treatment zone and the third dose of the photoactivating light as the third treatment zone to the ectatic cone and to deliver the second dose of the photoactivating light as the second treatment zone to areas of the cornea outside the ectatic cone.

12. The method of claim 7, wherein at least one of the light source and the one or more optical elements is operated to deliver the first dose of the photoactivating light and the second dose of the photoactivating light by:
simultaneously initiating delivery of the first treatment zone and the second treatment zone to the eye,
ceasing delivery of the second treatment zone after the second dose has been delivered, and
ceasing delivery of the first treatment zone after the first dose has been delivered, wherein delivery of the second treatment zone ceases before delivery of the first treatment zone ceases.

13. The method of claim 7, wherein at least one of the light source and the one or more optical elements are further operated to deliver the photoactivating light to one or more depths along an axis extending under a surface of the eye by adjusting an irradiance of the photoactivating light in each of the plurality of treatment zones, the pattern of photoactivating light being defined along a plane transverse to the axis.

14. The method of claim 7, further comprising applying the cross-linking agent to the eye.

* * * * *